United States Patent [19]
Satitpunwaycha

[11] Patent Number: 6,139,679
[45] Date of Patent: Oct. 31, 2000

[54] COIL AND COIL FEEDTHROUGH

[75] Inventor: Peter Satitpunwaycha, Santa Clara, Calif.

[73] Assignee: Applied Materials, Inc., Santa Clara, Calif.

[21] Appl. No.: 09/173,664

[22] Filed: Oct. 15, 1998

[51] Int. Cl.$^7$ .................................................. H01L 21/3065
[52] U.S. Cl. ................ 156/345; 118/723 I; 204/298.08; 204/298.12
[58] Field of Search .......................... 156/345; 118/723 I, 118/723 IR; 204/298.02, 298.08, 298.12

[56] References Cited

U.S. PATENT DOCUMENTS

| | | |
|---|---|---|
| 4,362,632 | 12/1982 | Jacob . |
| 4,725,449 | 2/1988 | Ehlers et al. . |
| 4,917,044 | 4/1990 | Yau et al. . |
| 4,941,915 | 7/1990 | Matsuoka et al. . |
| 5,521,351 | 5/1996 | Mahoney . |
| 5,560,776 | 10/1996 | Sugai et al. ............................ 118/723 I |
| 5,683,537 | 11/1997 | Ishii ....................................... 156/345 |
| 5,690,781 | 11/1997 | Yoshida et al. . |
| 5,855,685 | 1/1999 | Tobe et al. ............................. 118/723 I |
| 5,998,933 | 12/1999 | Shun'Ko ................................. 156/345 |

FOREIGN PATENT DOCUMENTS

| | | |
|---|---|---|
| 0601595 | 12/1993 | European Pat. Off. . |
| 0727807 | 8/1996 | European Pat. Off. . |
| 0945892 | 9/1999 | European Pat. Off. . |
| 7335162 | 12/1995 | Japan . |
| 888190 | 4/1996 | Japan . |
| 9515672 | 6/1995 | WIPO . |
| 9742648 | 11/1997 | WIPO . |

OTHER PUBLICATIONS

PCT Search Report issued Sep. 8, 1998 in PCT Appln No. PCT/US98/09739.

Kurt J. Lesker Company, *Ferrofluidics Feedthroughs*, Catalog pp. 14–10 and 14–12, dated prior to May, 8, 1997.

*Primary Examiner*—Thi Dang
*Attorney, Agent, or Firm*—Konrad Raynes & Victor

[57] ABSTRACT

A coil for a plasma chamber in a semiconductor fabrication process comprises a continuous, one-piece conductive conduit having a first end and a second end positioned on the chamber exterior, a coil portion positioned in the chamber interior and a feedthrough portion positioned in an aperture of the chamber wall. Because the conduit lacks any joints between the feedthrough and the interior coil portions, a potential source of coolant leak is eliminated.

30 Claims, 4 Drawing Sheets

COIL AND COIL FEEDTHROUGH

FIELD OF THE INVENTION

The present invention relates to ionized deposition and etching processes and apparatus, and more particularly, to a method and apparatus for mounting a coil to a chamber for the fabrication of semiconductor devices.

BACKGROUND OF THE INVENTION

To improve bottom coverage of high aspect ratio vias, channels and other openings in a wafer or other substrate during a deposition process, the deposition material may be ionized in a plasma prior to being deposited onto the substrate. The ionized deposition material may be redirected by electric fields to ensure more material reaches the bottom areas. It has been found that it is desirable to increase the density of the plasma to increase the ionization rate of the sputtered material in order to decrease the formation of unwanted cavities in the deposition layer. As used herein, the term "dense plasma" is intended to refer to one that has a high electron and ion density, in the range of $10^{11}$–$10^{13}$ ions/cm$^3$. Such a plasma is also useful for other semiconductor processes such as etching a wafer.

There are several known techniques for exciting a plasma with RF fields including capacitive coupling, inductive coupling and wave heating. In a standard inductively coupled plasma (ICP) generator, RF current passing through an antenna in the form of a coil surrounding the plasma induces electromagnetic currents in the plasma. These currents heat the conducting plasma by ohmic heating, so that it is sustained in steady state. As shown in U.S. Pat. No. 4,362,632, for example, current through a coil is supplied by an RF generator coupled to the coil through an impedance matching network, such that the coil acts as the first windings of a transformer. The plasma acts as a single turn second winding of a transformer.

As described in copending application Ser. No. 08/680, 335, entitled "Coils for Generating a Plasma and for Sputtering," filed Jul. 10, 1996 and assigned to the assignee of the present application, it has been recognized that the coil itself may provide a source of sputtered material to supplement the deposition material sputtered from the primary target of the chamber. Application of an RF signal to a coil positioned in the chamber can cause the coil to develop a negative bias which will attract positive ions which can impact the coil causing material to be sputtered from the coil.

Because relatively large currents are passed through the coil to energize the plasma, the coil often undergoes significant resistive heating. In addition, ions impacting the coil can further heat the coil if the coil is used as a sputtering source. As a result, an internal coil can reach relatively high temperatures which can have an adverse effect on the wafer, the wafer deposition process or even the coil itself. Moreover, the coil will cool once the deposition is completed and the current to the coil is removed. Each heating and subsequent cooling of the coil causes the coil to expand and then contract. This thermal cycling of the coil can cause target material deposited onto the coil to generate particulate matter which can fall onto and contaminate the wafer.

To reduce coil heating, it has been proposed in some applications to form the coil from hollow tubing through which a coolant such as water is passed. However, because the source of coolant is most conveniently located outside the chamber, the vacuum chamber in which the coil is located will typically require a feedthrough to permit coolant to pass through the chamber wall, through the coil and back to the exterior of the chamber. In addition, because the RF source may be located exterior to the chamber as well, a feedthrough for the RF power to the coil may also be needed in the chamber wall. However, the chamber wall is usually maintained at ground potential for safety and other reasons. Hence, the RF feedthrough should be capable of electrically insulating the coil from the chamber wall. Still further, the coolant and RF feedthroughs should be capable of maintaining a large pressure differential between the exterior of the chamber which is typically at ambient pressure, and the interior of the chamber which may be at 1 milliTorr or lower pressure. As a consequence, known RF and fluid feedthroughs tend to be relatively complex and difficult to install.

For example, one known feedthrough comprises a conduit having two ends, one external and one internal. Once the feedthrough is installed in the chamber wall, the coil may be welded or otherwise joined to the internal end and sources of RF energy and coolant are coupled to the external end. However, it has been recognized by the present applicant that the internal joint between the coil and the feedthrough is a potential leakage point which could significantly disrupt the semiconductor processes performed in the chamber and potentially damage the chamber itself.

SUMMARY OF THE PREFERRED EMBODIMENTS

It is an object of the present invention to provide an improved method and apparatus for mounting a coil, which obviates, for practical purposes, the abovementioned limitations, particularly in a manner requiring a relatively uncomplicated arrangement.

These and other objects and advantages are achieved by, in accordance with one aspect of the invention, an RF coil adapted to generate a plasma in a chamber interior, wherein the RF coil includes a continuous, one-piece conduit of conductive material having a first end and a second end positioned on the chamber exterior, a coil portion positioned in the chamber interior and a feedthrough portion positioned in an aperture of the chamber wall. Because the conduit lacks any joints between the feedthrough and coil portions, a potential source of coolant leak is eliminated.

In another aspect of the present invention, the RF coil has a feedthrough assembly which includes a flange adapted to engage an interior surface of the chamber wall, and a fastener positioned on the chamber exterior. Such an arrangement permits the feedthrough assembly to be securely affixed to the chamber wall by clamping the chamber wall between the feedthrough flange and fastener. Because the fastener is secured to the feedthrough assembly from the exterior of the chamber, installation of the RF coil is significantly facilitated as discussed below.

DETAILED DESCRIPTION OF THE DRAWINGS

Figure 1:
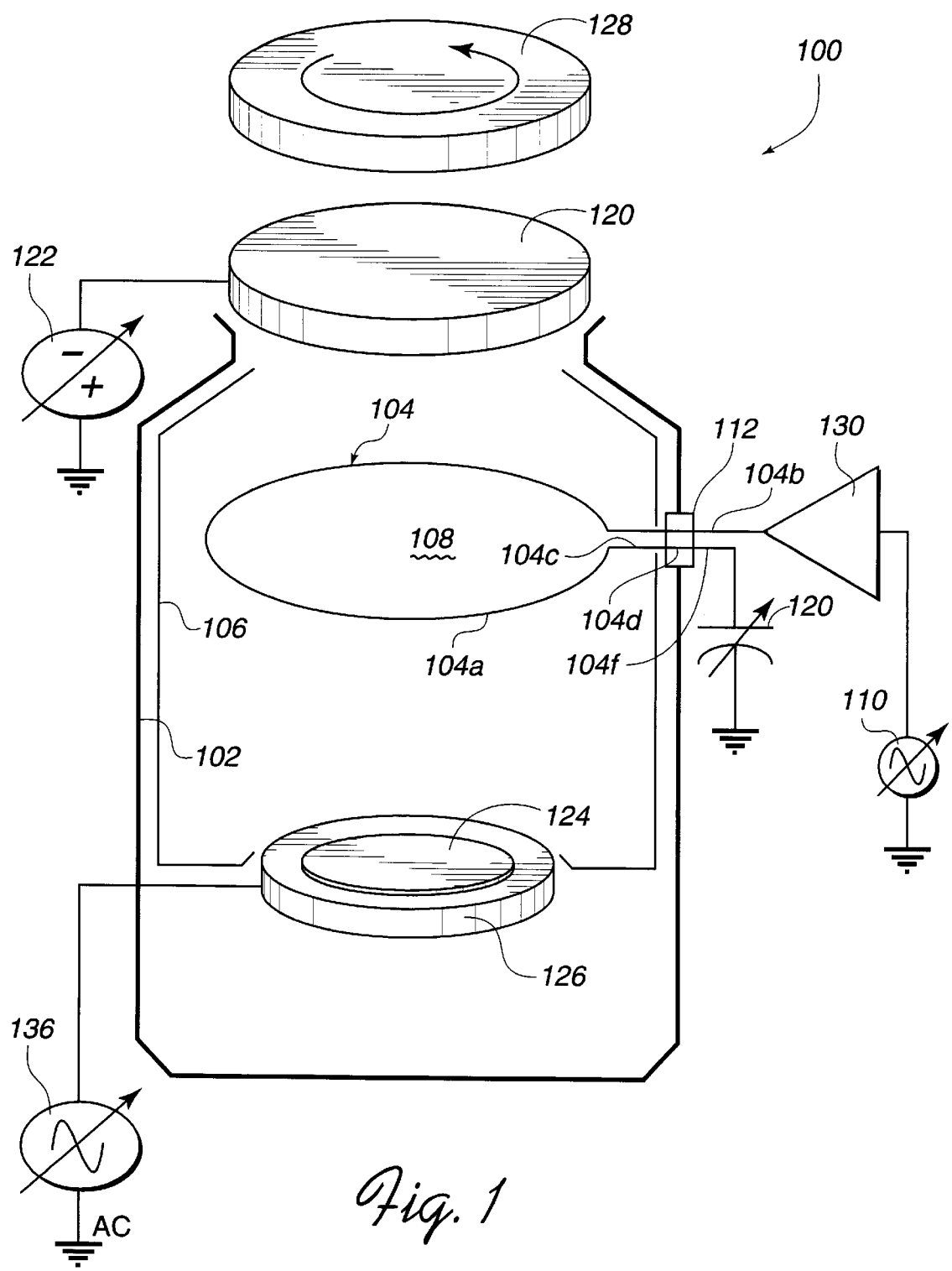
FIG. 1 is a schematic diagram of electrical interconnections to a plasma generating coil in accordance with the present invention.
Figure 2:
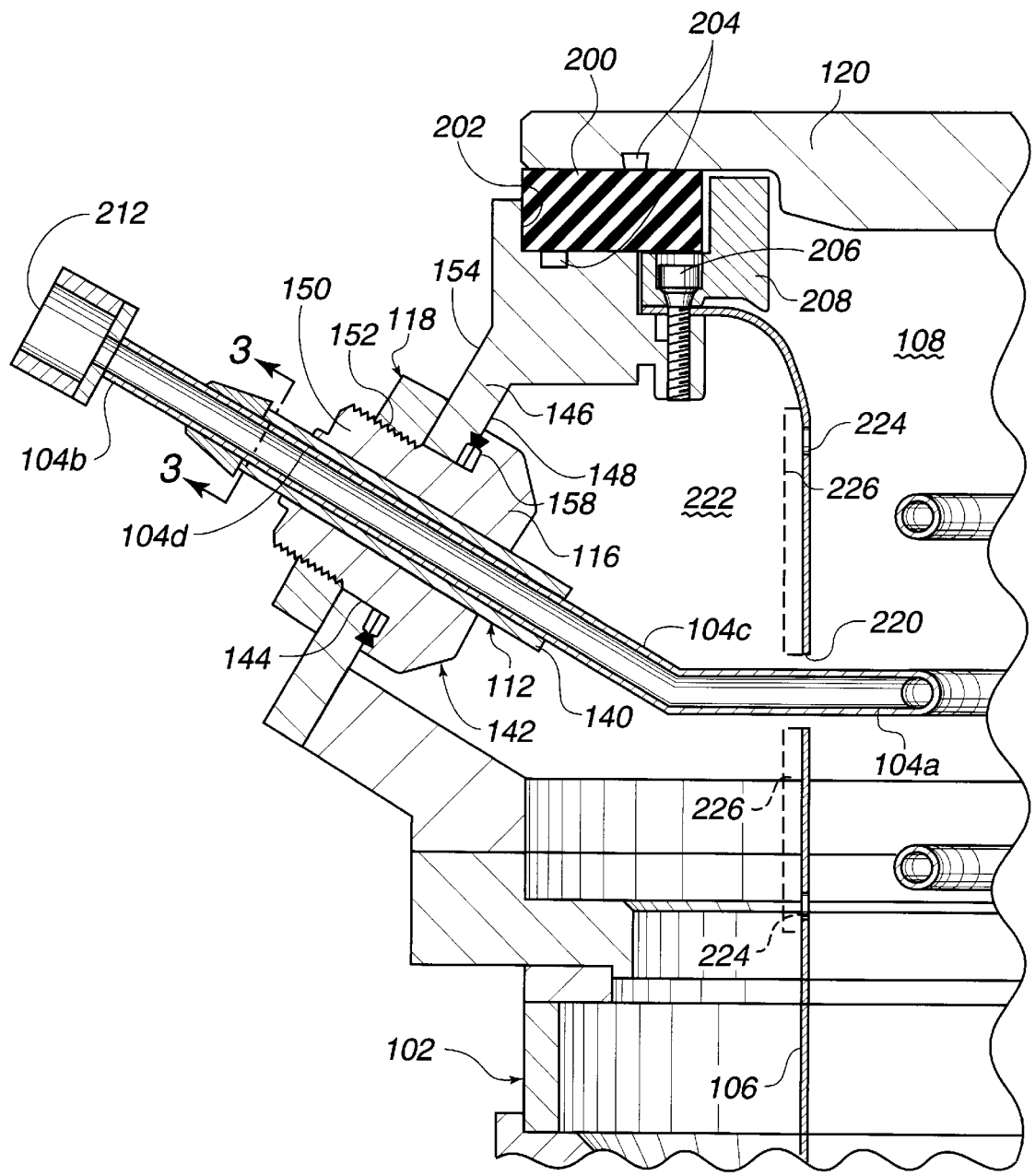
FIG. 2 is a cross-sectional view of a chamber wall feedthrough in accordance with the present invention.

Referring to FIGS. 1 and 2, a plasma generator utilizing an RF coil in accordance with a first embodiment of the present invention comprises a substantially cylindrical plasma chamber 100 which is received in a vacuum chamber 102 (shown schematically in FIG. 1). The plasma chamber 100 of this embodiment has a one-turn or multiple-turn coil 104 which includes a portion 104a positioned in a generally cylindrical shield 106 and within an interior plasma generation area 108 within the shield 106. Radio frequency (RF) energy from an RF generator 110 coupled to an external portion 104b of the coil 104 passes through a feedthrough assembly 112 mounted in an exterior wall of the chamber 102 to an interior portion 104c and the remainder of the RF coil 104. The RF energy is inductively coupled into the interior area 108 of the deposition system 100, which energizes a plasma within the deposition system 100. As explained in greater detail below, the RF coil 104 includes a continuous, one piece tubular conduit which passes from the exterior of the chamber (coil portion 104b), through the feedthrough assembly 112 (coil portion 104d), around the interior of the chamber (coil portion 104a) and back through the feedthrough assembly 112 (another coil portion 104d) to the exterior of the chamber (coil portion 104f) without any joints which may cause leaks. In addition, the feedthrough assembly 112 has an internal flange 116 (FIG. 2) which cooperates with an external fastener 118 to significantly facilitate installation of the coil 104 into the chamber 102.

During a sputter deposition process, an ion flux strikes a negatively biased target 120 positioned at the top of the chamber 102. The target 120 is preferably negatively biased by a DC power source 122. The coil 104 may develop a negative bias to attract ions. The plasma ions eject material from the target 120 and possibly also the coil 104 onto a substrate 124 which may be a wafer or other workpiece which is supported by a pedestal 126 at the bottom of the deposition system 100. A rotating magnet assembly 128 provided above the target 120 produces magnetic fields which sweep over the face of the target 120 to promote a desired pattern of erosion of the target face.

The atoms of material ejected from the target 120 and coil 104 are in turn ionized by the plasma being energized by the coil 104 which is inductively coupled to the plasma. The RF generator 110 is preferably coupled to the external end 104b of the coil 104 through an amplifier and impedance matching network 130. The other external end 104f of the RF coil 104 is coupled to ground, preferably through a blocking capacitor 132 which may be a variable capacitor, if coil sputtering is desired. The ionized deposition material is attracted to the substrate 124 and forms a deposition layer thereon. The pedestal 126 may be negatively biased by an AC (or DC or RF) source 136 so as to externally bias the substrate 124. Also, the substrate 124 may self bias in some applications such that external biasing of the substrate 124 may optionally be eliminated.

Figure 3:
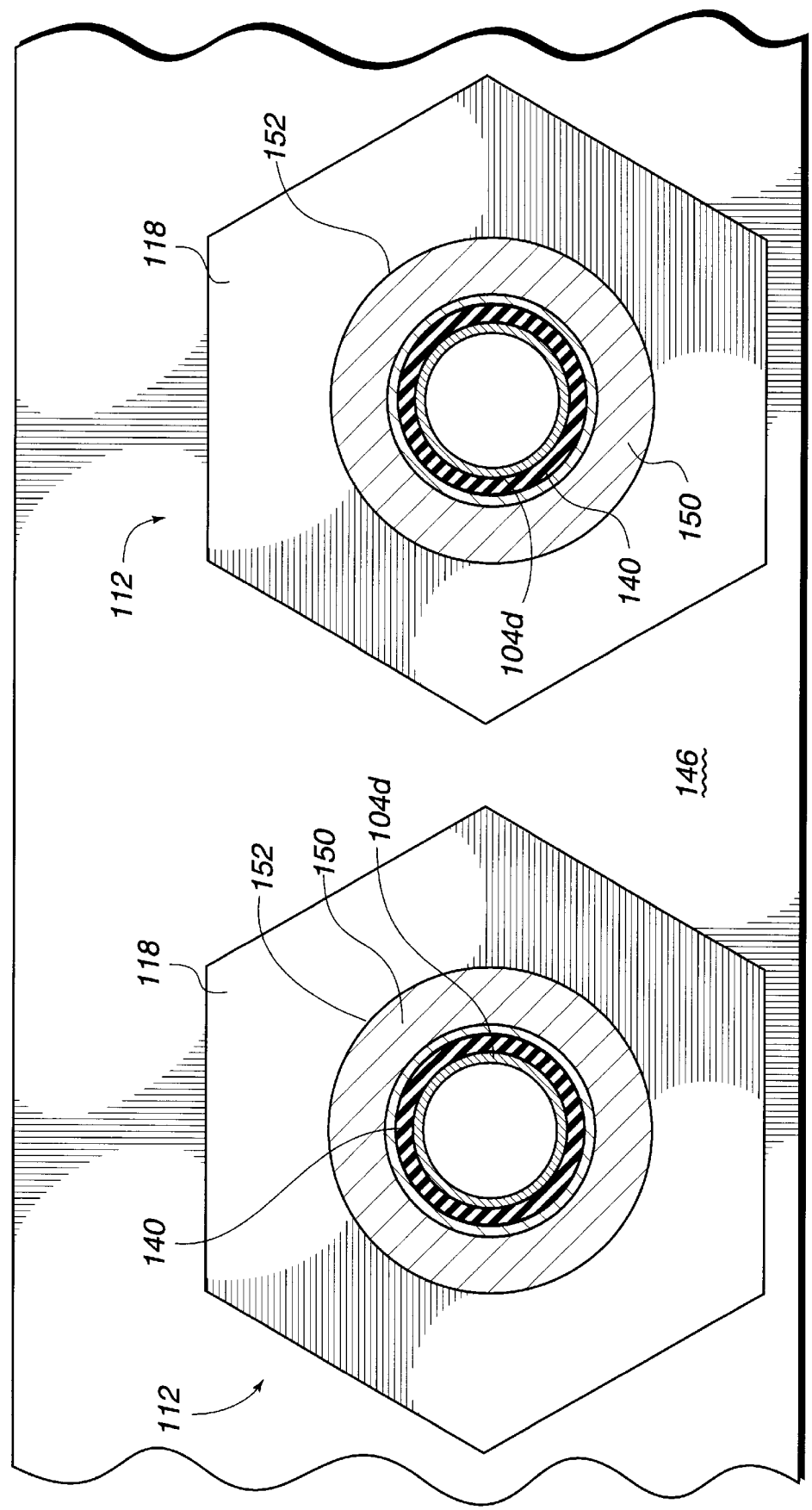
FIG. 3 is a cross-sectional view of the chamber wall feedthrough of FIG. 2 as viewed along the lines 3—3 of FIG. 2.

In accordance with one aspect of the present invention, the coil portions 104a–f may be formed from a single one-piece hollow conduit of conductive material, which obviates the need for any joints in the interior of the chamber which are a potential leakage source. As shown in FIGS. 2 and 3, each portion 104d of the coil 104 which passes through the chamber wall has an associated feedthrough assembly 112 which includes an insulator 140 positioned between the conductive portions of the feedthrough 112 and the coil 104 which is at RF potential when in use. In the illustrated embodiment, each insulator 140 is a generally cylindrically shaped ceramic tube having an inner diameter of sufficient size to receive the outer diameter of the coil portion 104d. Of course, the size and shape of the insulator 140 may vary depending upon the size and shape of the portion of the coil which passes through the feedthrough. The insulator 104 is preferably permanently attached to the RF coil by brazing, welding or other suitable attachment methods. In addition to ceramic materials, it is anticipated that the insulator 140 may be made of other insulative and temperature resistant materials.

Each insulator 140 is in turn received within a one-piece feedthrough body 142 which includes the flange 116 formed integrally with the feedthrough body 142. Again, the insulators 140 are preferably permanently attached to the feedthrough body 142 by brazing, welding or other suitable attachment methods.

Each feedthrough body 142 is slidingly received in an associated aperture 144 of a wall 146 of the vacuum chamber 102 so that flange 116 engages the interior surface 148 of chamber wall 146. A barrel portion 150 of the feedthrough body 142 extends through the chamber wall aperture 144 so that a threaded surface 152 protrudes to the exterior of the chamber 102. The fastener 118 in the illustrated embodiment is a nut which may be threaded onto the threaded surface 152 of the feedthrough body 142 until it is stopped by engagement with the exterior surface 154 of the chamber wall 146. In this manner, the feed through assembly 112 may be securely attached to the chamber 102 with the chamber wall 146 compressed between the flange 116 and the fastener 118. A seal ring 158 is preferably compressed between the flange 116 and the interior surface 148 of the wall 146 to provide a pressure tight coupling between the feedthrough 112 and the chamber 102.

In the illustrated embodiment, the target 120 is insulatively spaced from the walls of the chamber 102 by an insulator ring 200 which is made of suitable insulative materials such as ceramics. The insulator ring 200 is in turn received by a channel 202 in the top wall 146 of the chamber. Suitable seals 204 may be provided between the insulator ring and the target 120 and chamber wall 146, respectively.

To confine the plasma in the interior 108 and protect the interior walls of the chamber from being deposited with material sputtered from the target, the chamber may have a shield 106 which is typically grounded. The shield 106 may be fastened to the chamber 102 by a suitable fastener 206. A grounded darkspace shield 208 may be fastened by the fastener 206 between the target 120 and the shield 106 to reduce sputtering of the target edges.

To install the coil 104 into the chamber 102, target 120 is removed to provide access to the interior of the chamber 102. The coil 104 is then placed into the chamber and the two barrels 150 of the two feedthroughs 112 are passed through respective apertures 144 in the chamber wall so that the coil ends 104b and 104f are positioned on the exterior of the chamber. Exterior nuts 118 are then threaded onto the respective exterior threaded portions 152 of the feedthroughs 112 and tightened so that the seals 158 provide a gas tight seal between the feedthroughs and the chamber walls. Suitable RF and coolant sources are coupled to the coil ends 104b and 104f at each of the respective couplers 212 (FIG. 2). In this manner, a coil comprising a single, one-piece tube may be installed in the chamber without any joints in the tubing from one exterior end of the coil, through the interior of the chamber, and back to the other exterior end of the coil. Moreover, the feedthroughs 112 can fully support the coil so that no other connection or support need be provided in the interior of the chamber.

As best seen in FIG. 2, the coil extends through the shield 106 through an aperture 220 in the shield 106. The aperture 220 is preferably sufficiently small to minimize the passage of plasma or deposition material from the interior 108 of the shield 106 to the space 222 between the shield 106 and the chamber 102. Because the feedthrough 112 is relatively large, the shield 106 may be formed in one or more sections in which a lower section which includes the lower portion of the apertures 220, is installed before the coil 104. After the coil 104 is installed, the remaining sections of the shield 106 may be installed to complete the shield apertures 220 about the coil sections 104c. Alternatively, the shield 106 may be formed primarily of a single cylindrical shaped member having apertures 224 (depicted in phantom) large enough to permit passage of the feedthroughs 112 during installation of the coil 104. Following installation of the coil 104, separate shield cover members 226 may be attached to the shield to provide relatively small apertures 220 around the coil 104. In addition, insulative labyrinth structures in accordance with structures disclosed in copending application Ser. No. 08/853,024, entitled "Recessed Coil For Generating a Plasma," filed May 8, 1997 and application Ser. No. 08/856, 423, entitled "Powered Shield Source for High Density Plasma," filed May 14, 1997, may be provided to fill the gap between the coil and the shield and to inhibit deposition material from bridging the gap between the coil and shield would could short the coil to the shield.

Figure 4:
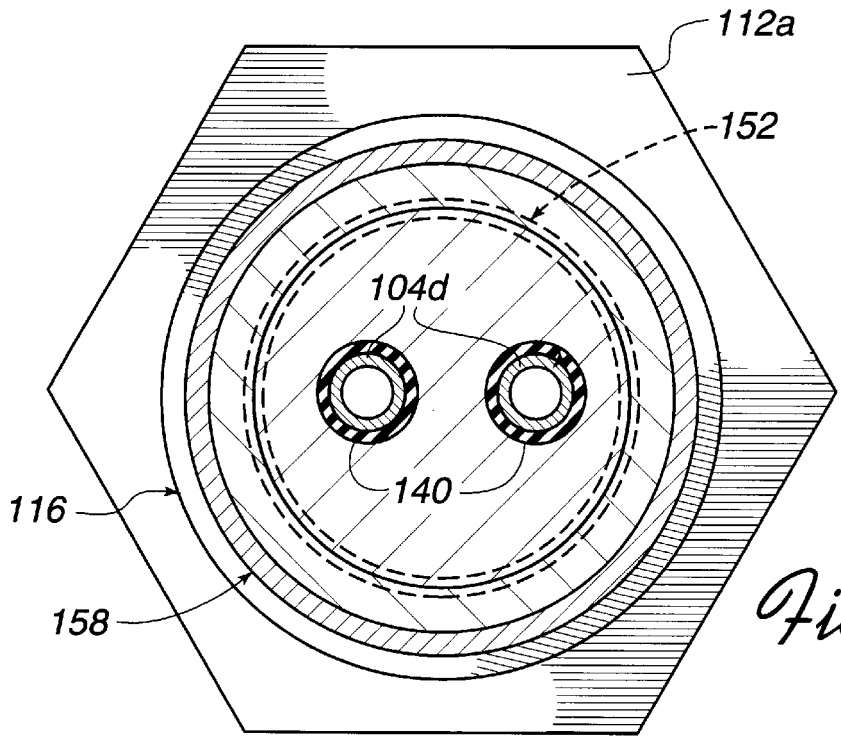
FIG. 4 is a cross-sectional view of a chamber wall feedthrough in accordance with an alternative embodiment.

FIG. 4 illustrates an alternative embodiment in which both coil feedthrough portions 104d and their associated insulators 140 of the coil ends 104b and 104f are received by a single feedthrough body barrel portion 150a. A single nut 112a is threaded onto threads surface 152a of the barrel portion 150a to secure the feedthroughs to the chamber wall.

Figure 5:
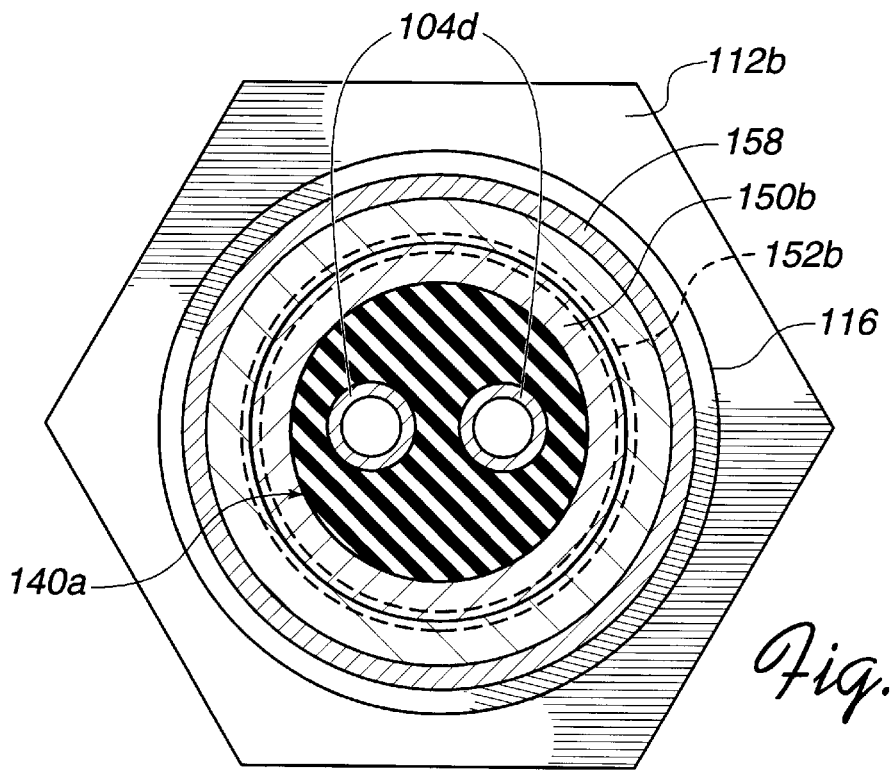
FIG. 5 is a cross-sectional view of a chamber wall feedthrough in accordance with an another alternative embodiment.

FIG. 5 illustrates another alternative embodiment in which both feedthrough portions 104d are received by parallel apertures in a single tubular insulator 140a. The insulator 140a is in turn received by a single feedthrough body barrel portion 150b. Again, in this embodiment a single nut 112a is threaded onto threads surface 152b of the barrel portion 150b to secure the feedthroughs to the chamber wall.

The preferred coil embodiments discussed herein can be used to deposit many different types of metals, such as Al, Ti, Ta, Cu, etc., and metal nitrates, such as TiN, TaN, etc. If one or more additional coils are used with the tubular coil, then the tubular coil and additional coils may be comprised of the same material or, alternatively, different materials. Still further, additional tubular cooling coils as well as sputtering coils may be added to the embodiments discussed herein. The use of multiple coils is disclosed in the aforementioned copending application Ser. No. 08/680,335, entitled "Coils for Generating a Plasma and for Sputtering."

In addition to the circular shape depicted herein, it is anticipated that the central portion of the coil within the chamber may have a variety of shapes. For example, the coil may have flat spiral or frusto-conical multi-turn shapes as well as described in copending application Ser. No. 08/857, 719, entitled "Central Coil Design for Ionized Metal Plasma Deposition," filed May 16, 1997, for example. Still further, a one-piece tubular coil in accordance with the present invention may have sputtering surfaces or deposition blocking surfaces attached or formed on the exterior of the tubular coil as described in copending application Ser. No. 08/857, 944, entitled "Hybrid Coil Design for Ionized Deposition," filed May 16, 1997, for example.

The appropriate RF generators and matching circuits are components well known to those skilled in the art. For example, an RF generator such as the ENI Genesis series which has the capability to "frequency hunt" for the best frequency match with the matching circuit and antenna is suitable. The frequency of the generator for generating the RF power to the coil 104 is preferably 2 MHz but it is anticipated that the range can vary. For example, 1 MHz to 28 MHz may be satisfactory. An RF power setting of 1.5 kW is preferred but a range of 1.5–5 kW is satisfactory. In addition, a DC power setting for biasing the target 128 of 8–12 kW is preferred but a range of 2–24 kW and a pedestal 126 bias voltage of −30 volts DC are satisfactory. The above parameters may vary depending upon the particular application.

A variety of sputtering gases may be utilized to generate the plasma including Ar, and a variety of reactive gases such as $NF_3$, $CF_4$, $H_2$, $O_2$ and many others may be used. Various sputtering gas pressures are suitable including pressures of 0.1–50 mTorr. For ionized PVD, a pressure between 10 and 100 mTorr such as 30 mTorr often provides better ionization of sputtered material.

The present invention may also be employed in alternative feedthroughs such as those described in copending application Ser. No. 09/173,662 entitled "Water Cooled Coil For a Plasma Chamber," filed Oct. 15, 1998, by Anantha Subramani, Michael Rosenstein, Timothy C. Lommasson and Peter Satitpunwaycha, which is incorporated by reference in its entirety.

It will, of course, be understood that modifications of the present invention, in its various aspects, will be apparent to those skilled in the art, some being apparent only after study others being matters of routine mechanical and electronic design. Other embodiments are also possible, their specific designs depending upon the particular application. As such, the scope of the invention should not be limited by the particular embodiments herein described but should be defined only by the appended claims and equivalents thereof.

What is claimed is:

1. An apparatus for processing a workpiece, comprising:
   a chamber having a wall and an interior within said wall adapted to be evacuated to an internal pressure substantially below an external pressure external to said chamber wall, wherein said chamber wall defines an aperture;
   a workpiece support surface positioned within said chamber interior for supporting a workpiece;
   an RF coil comprising a continuous, 1-piece hollow conductive body having two ends positioned on the exterior of said chamber, two feedthrough portions passing through said chamber wall aperture and a central portion between said feedthrough portions positioned in said chamber interior, said RF coil being positioned to couple RF energy to maintain a plasma in said chamber for processing said workpiece; and
   a feedthrough assembly which includes an insulator member permanently attached to at least one of said feedthrough portions of said RF coil body and positioned adjacent said chamber wall aperture between said RF coil body and said chamber wall to insulate said RF coil body from said chamber wall.

2. The apparatus of claim 1 further comprising a source of deposition material for depositing onto said workpiece.

3. An apparatus for processing a workpiece, comprising:
   a chamber having an interior adapted to be evacuated to a pressure substantially below ambient pressure external to said chamber;
   a workpiece support surface positioned within said chamber interior for supporting a workpiece;
   an RF coil comprising a continuous, 1-piece hollow conductive body having two ends positioned on the exterior of said chamber and a central portion between said ends positioned in said chamber interior, said RF coil being positioned to couple RF energy to maintain a plasma in said chamber for processing said workpiece; and
   a source of deposition material for depositing onto said workpiece wherein said source is a sputterable target adapted to provide sputtered deposition material.

4. The apparatus of claim 2 or 3 wherein said plasma has a density sufficient to ionize a substantial portion of said deposition material being deposited onto said workpiece.

5. The apparatus of claim 1 wherein said feedthrough assembly further includes a second insulator member permanently attached to the other feedthrough portion of said RF coil body and positioned adjacent said aperture between said RF coil body and said chamber wall to insulate said RF coil body from said chamber wall.

6. The apparatus of claim 1 wherein said chamber wall has an interior surface and an exterior surface adjacent said aperture and said feedthrough assembly includes a feedthrough body coupled to said RF coil body and having a flange portion adapted to engage said chamber wall interior surface, said assembly further comprising a fastener for fastening to said feedthrough body and engaging said chamber wall exterior surface to thereby compress said chamber wall between said fastener and said flange portion.

7. The apparatus of claim 6 wherein said insulator member is positioned between said RF coil body and said flange to insulate said RF coil body from said flange.

8. The apparatus of claim 2 wherein said source is a sputterable target adapted to provide sputtered deposition material.

9. An antennae for coupling RF energy into a semiconductor processing chamber comprising:
   a continuous, 1-piece hollow RF energy conductive body having two ends adapted to be positioned on the exterior of said chamber and a central portion between said ends and adapted to be positioned in said chamber interior; and
   a feedthrough assembly carried by said ends of said body, said assembly including an insulator member permanently attached to said conductive body and adapted to insulate said conductive body from said chamber.

10. The antennae of claim 9 wherein said chamber has an aperture, and a wall which has an interior surface and an exterior surface adjacent said aperture and said feedthrough assembly includes a feedthrough body coupled to said RF coil body and having a flange portion adapted to engage said chamber wall interior surface, said assembly further comprising a fastener for fastening to said feedthrough body and engaging said chamber wall exterior surface to thereby compress said chamber wall between said fastener and said flange portion.

11. The antennae of claim 10 wherein said insulator member is positioned between said RF body and said feedthrough body to insulate said RF body from said feedthrough body.

12. The antennae of claim 9, wherein said RF body is comprised of a sputter deposition material selected from the group of titanium, tantalum, copper and aluminum.

13. A semiconductor fabrication system, comprising:
   a low pressure chamber having a wall having an exterior surface which defines an exterior of said chamber and an interior surface which defines an interior of said chamber, said chamber interior being adapted to be maintained at a pressure substantially below the pressure of said chamber exterior, said chamber wall further defining an aperture;
   an RF coil adapted to generate a plasma in said chamber interior, said RF coil including a continuous, one-piece conduit of conductive material, said conduit defining an interior channel adapted to receive a flow of coolant through said conduit, said conduit having a first end and a second end positioned on said chamber exterior, a coil portion positioned in said chamber interior and a feedthrough portion positioned in said wall aperture; and
   a feedthrough assembly which includes an insulator member permanently attached to at least one of said feedthrough portions of said RF coil body and positioned adjacent said chamber wall aperture between said RF coil body and said chamber wall to insulate said RF coil body from said chamber wall, a feedthrough body having a flange portion adapted to engage said chamber wall interior surface, and a threaded barrel-shaped through portion which extends through said chamber wall aperture; and
   a nut adapted to threadably fasten to said feedthrough body through portion and engage said chamber wall exterior surface to thereby compress said chamber wall between said fastener and said flange portion.

14. An antennae for coupling RF energy into a semiconductor processing chamber comprising:
   a continuous, 1-piece hollow RF energy conductive body having two ends adapted to be positioned on the exterior of said chamber and a central portion between said ends and adapted to be positioned in said chamber interior; and
   a feedthrough assembly carried by said ends of said body, said assembly including an insulator member adapted to insulate said conductive body from said chamber;
   wherein said RF body is comprised of a sputter deposition material selected from the group of titanium, tantalum, copper and aluminum.

15. An RF coil feedthrough for a tubular RF coil and a semiconductor processing chamber having a wall and an interior within said wall adapted to be evacuated to an internal pressure substantially below an external pressure external to said chamber wall, wherein said chamber wall defines an aperture and has an interior wall surface and an exterior wall surface adjacent said aperture; the feedthrough comprising:
   a feedthrough body having a flange portion adapted to engage said chamber wall interior surface, and a through portion which extends through said chamber wall aperture;
   an insulator body disposed between said feedthrough body and said coil and adapted to electrically insulate said RF coil from said feedthrough body; and
   a fastener adapted to fasten to said feedthrough body through portion and engage said chamber wall exterior surface to thereby compress said chamber wall between said fastener and said flange portion.

16. The feedthrough of claim 15 wherein said through portion of said feedthrough body is barrel-shaped.

17. The feedthrough of claim 15 wherein said through portion is threaded and said fastener is a nut adapted to threadably fasten to said through portion of said feedthrough body.

18. The feedthrough of claim 15 wherein said insulator body is permanently attached to said coil.

19. The feedthrough of claim 15 wherein said insulator body is permanently attached to said coil by one of welding and brazing.

20. The feedthrough of claim 15 wherein said insulator body is permanently attached to said feedthrough body.

21. The feedthrough of claim 15 wherein said insulator body is permanently attached to said feedthrough body by one of welding and brazing.

22. The feedthrough of claim 15 further comprising a seal ring disposed between said flange portion and said chamber wall and adapted to provide a pressure tight seal between said flange portion and said chamber wall.

23. A method of maintaining a plasma in a semiconductor processing chamber, comprising:

coupling RF energy to at least one exterior end of an RF coil comprising a continuous, 1-piece hollow conductive body having two exterior ends positioned on the exterior of said chamber, two feedthrough portions passing through said chamber wall aperture, a central portion between said ends positioned in said chamber interior, and a feedthrough assembly which includes an insulator member permanently attached to at least one of said feedthrough portions of said RF coil body and positioned adjacent said chamber wall aperture between said RF coil body and said chamber wall to electrically insulate said RF coil body from said chamber wall, said RF coil central portion being positioned to couple said RF energy to maintain a plasma in said chamber for processing a workpiece in said chamber; and providing coolant to at least one exterior end of said coil;

passing coolant through said central portion of said coil; and receiving coolant from the other of said exterior ends of said coil.

24. A method of assembling a chamber for processing a workpiece, comprising:

positioning an RF coil in a chamber to couple RF energy to maintain a plasma in said chamber for processing said workpiece, said positioning comprising positioning two ends of a continuous, 1-piece hollow conductive body to extend through an aperture in a wall of said chamber to the exterior of said chamber, positioning a feedthrough assembly which includes a feedthrough body and an insulator member permanently attached to at least one of said feedthrough portions of said RF coil body, adjacent to said chamber wall aperture between said RF coil body and said chamber wall to electrically insulate said RF coil body from said chamber wall and positioning a central portion of said coil body in said chamber interior; and fastening said feedthrough body to said chamber wall to provide a pressure tight, seal over said chamber aperture between said RF coil body and said chamber wall.

25. The method of claim 24 wherein said feedthrough assembly positioning further includes positioning a second insulator member permanently attached to other of said feedthrough portions of said RF coil body, adjacent to said chamber wall aperture between said RF coil body and said chamber wall to electrically insulate said RF coil body from said chamber wall.

26. The method of claim 24 wherein said feedthrough assembly positioning further includes positioning a flange portion of said feedthrough body to engage a chamber wall interior surface, and positioning a through portion of said feedthrough body to extend through said chamber wall aperture, and wherein said fastening includes fastening said fastener to said through portion of said feedthrough body and engaging said chamber wall exterior surface to thereby compress said chamber wall between said fastener and said flange portion.

27. The method of claim 26 wherein said insulator member of said feedthrough assembly positioning is permanently attached to said flange portion to electrically insulate said RF coil body from said flange portion of said feedthrough body.

28. The method of claim 26 wherein said fastening includes threading a nut onto a threaded portion of said through portion of said feedthrough body so that said nut engages said chamber wall exterior surface.

29. A method of assembling a chamber for processing a workpiece, comprising:

positioning an RF coil in a chamber to couple RF energy to maintain a plasma in said chamber for processing said workpiece, said positioning comprising positioning two ends of a hollow conductive body to extend through an aperture in a wall of said chamber to the exterior of said chamber, positioning a feedthrough assembly which includes a feedthrough body and an insulator member so that a flange portion of said feedthrough body engages a chamber wall interior surface, and a through portion of said feedthrough body extends through said chamber wall aperture wherein said insulator member is positioned between at least one of said feedthrough portions of said RF coil body and said feedthrough body to electrically insulate said RF coil body from said chamber wall and positioning a central portion of said coil body in said chamber interior; and fastening a fastener to said feedthrough body so that said fastener engages a chamber wall exterior surface to thereby compress said chamber wall between said fastener and said flange portion of said feedthrough body to provide a pressure tight, seal over said chamber aperture between said RF coil body and said chamber wall.

30. The method of claim 29 wherein said fastening a fastener includes threading a nut onto a threaded portion of said through portion of said feedthrough body so that said nut engages said chamber wall exterior surface to thereby compress said chamber wall between said nut and said flange portion of said feedthrough body.

* * * * *